US008981455B2

(12) United States Patent
Aoyama

(10) Patent No.: US 8,981,455 B2
(45) Date of Patent: Mar. 17, 2015

(54) SEMICONDUCTOR MEMORY DEVICE AND MANUFACTURING METHOD THEREOF

(71) Applicant: Kabushiki Kaisha Toshiba, Minato-ku, Tokyo (JP)

(72) Inventor: Kenji Aoyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/779,509

(22) Filed: Feb. 27, 2013

(65) Prior Publication Data

US 2014/0048864 A1 Feb. 20, 2014

(30) Foreign Application Priority Data

Aug. 20, 2012 (JP) ................................. 2012-181810

(51) Int. Cl.
| | | |
|---|---|---|
| H01L 29/788 | (2006.01) | |
| H01L 29/66 | (2006.01) | |
| H01L 21/28 | (2006.01) | |
| H01L 27/115 | (2006.01) | |

(52) U.S. Cl.
CPC ........ *H01L 29/788* (2013.01); *H01L 29/66825* (2013.01); *H01L 21/28273* (2013.01); *H01L 29/7881* (2013.01); *H01L 27/11521* (2013.01)
USPC ........... 257/316; 257/314; 257/315; 257/319; 257/E21.422; 257/E29.3

(58) Field of Classification Search
None
See application file for complete search history.

(56) References Cited

U.S. PATENT DOCUMENTS

| | | | |
|---|---|---|---|
| 6,455,440 B1 * | 9/2002 | Jeng | 438/770 |
| 7,199,425 B2 * | 4/2007 | Ozawa | 257/317 |
| 7,906,806 B2 | 3/2011 | Rosmeulen | |
| 2004/0238881 A1 * | 12/2004 | Ozawa | 257/316 |
| 2007/0145470 A1 * | 6/2007 | Ozawa | 257/316 |
| 2007/0145471 A1 * | 6/2007 | Ozawa | 257/317 |
| 2007/0235793 A1 | 10/2007 | Yamazaki et al. | |
| 2008/0061350 A1 * | 3/2008 | Watanabe | 257/315 |
| 2008/0197403 A1 * | 8/2008 | Ozawa et al. | 257/321 |
| 2009/0140317 A1 * | 6/2009 | Rosmeulen | 257/316 |
| 2011/0147822 A1 * | 6/2011 | Aoyama et al. | 257/319 |
| 2014/0042517 A1 * | 2/2014 | Aoyama | 257/316 |

FOREIGN PATENT DOCUMENTS

| | | | |
|---|---|---|---|
| JP | 2007-250974 A | 9/2007 | |
| JP | 2007-288177 A | 11/2007 | |
| JP | 2009-141354 A | 6/2009 | |
| JP | 2011-142246 A | 7/2011 | |

\* cited by examiner

*Primary Examiner* — Evan Pert
*Assistant Examiner* — Fazli Erdem
(74) *Attorney, Agent, or Firm* — Holtz, Holtz, Goodman & Chick PC

(57) ABSTRACT

In accordance with an embodiment, a semiconductor memory device includes a substrate with a semiconductor layer and memory cells on the semiconductor layer. Each memory cell includes a laminated body on the semiconductor layer, a gate insulating film on the laminated body, and a control gate on the gate insulating film. The laminated body includes a tunnel insulating film and a floating gate subsequently laminated in a direction vertical to a front surface of the substrate for N (a natural number equal to or above 2) times. A dimension of a top face of any floating gate in a second or subsequent layer is smaller than a dimension of a bottom surface of the floating gate in the lowermost layer in at least one of a first direction parallel to the front surface of the substrate and a second direction crossing the first direction.

9 Claims, 11 Drawing Sheets

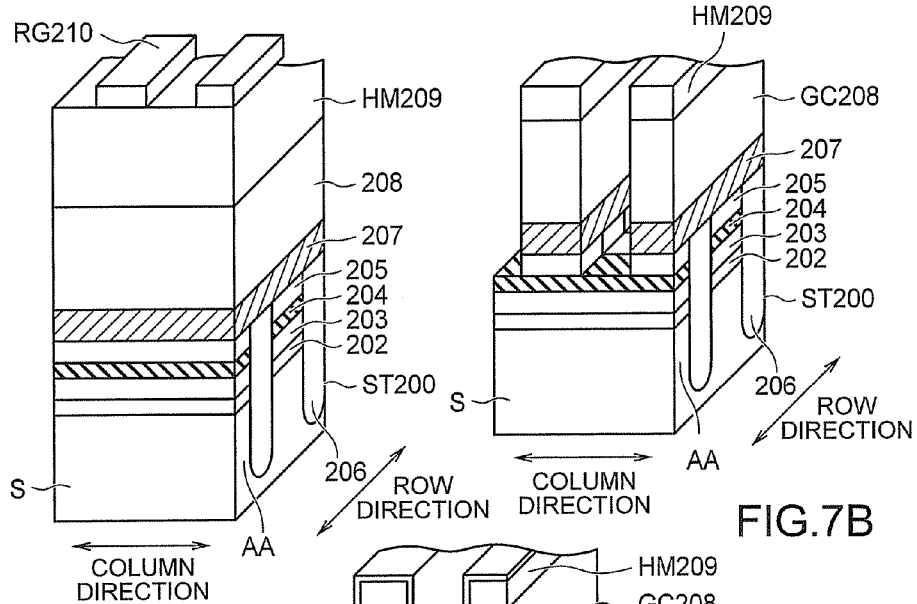
FIG.7A
FIG.7B
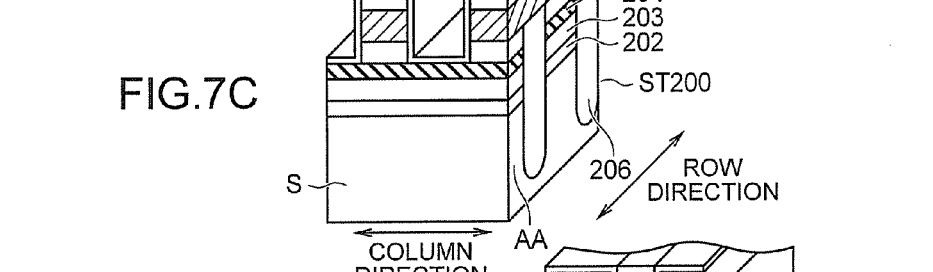
FIG.7C
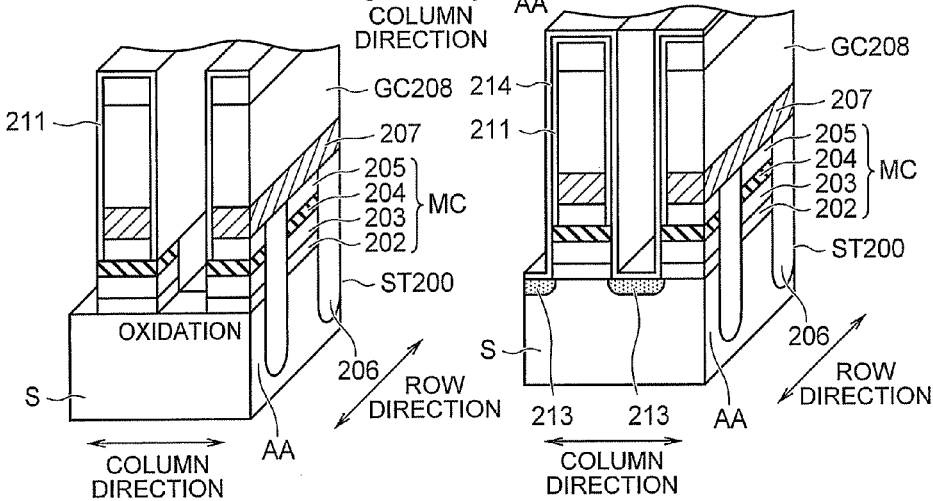
FIG.7D
FIG.7E

SEMICONDUCTOR MEMORY DEVICE AND MANUFACTURING METHOD THEREOF

CROSS REFERENCE TO RELATED APPLICATIONS

This application is based upon and claims the benefit of priority from the prior Japanese Patent Application No. 2012-181810, filed on Aug. 20, 2012, the entire contents of which are incorporated herein by reference.

FIELD

Embodiments described herein relate generally to a semiconductor memory device and a manufacturing method thereof.

BACKGROUND

Miniaturization of a nonvolatile semiconductor memory device such as an NAND flash memory in a longitudinal direction (a film thickness or the like) and a transverse direction (a wiring width, a space width, or the like) has been advanced with needs for high capacity.

As the miniaturization in the longitudinal direction, there is suggested a structure called lamination layer FG in which a floating gate (which will be appropriately referred to as "FG" hereinafter) is divided into two pieces, an equivalent oxide film thickness of a tunnel oxide film is divided into two, one of the two is arranged at the same position as a conventional tunnel oxide film, and the other is arranged at a position where the floating gate is divided into two pieces.

However, when simply shrinking an element in the miniaturization in the transverse direction is tried, there occurs a phenomenon called an inter-cell interference (Yupin/Enda) effect that a threshold value of a memory cell apparently increases due to a parasitic capacity between FGs that are adjacent to each other or a parasitic capacity between an FG and an active area (AA) that are adjacent to each other, and a breakthrough for such a limit has not been developed yet.

BRIEF DESCRIPTION OF THE DRAWINGS

In the accompanying drawings,

FIG. 7A to FIG. 7E are cross-sectional perspective views for explaining a manufacturing method for the memory depicted in each of FIG. 5 and FIG. 6;

DETAILED DESCRIPTION

In accordance with an embodiment, a semiconductor memory device includes a substrate including a semiconductor layer on a front surface thereof and a plurality of memory cells on the semiconductor layer. Each memory cell includes a laminated body, a gate insulating film on the laminated body, and a control gate on the gate insulating film. The laminated body includes a tunnel insulating film and a floating gate on the tunnel insulating film which are laminated in a direction vertical to the front surface of the substrate for N (a natural number equal to or above 2) times. A dimension of a top face of any floating gate in a second or subsequent layer in the floating gates is smaller than a dimension of a bottom surface of the floating gate in the lowermost layer in at least one of a first direction parallel to the front surface of the substrate and a second direction crossing the first direction.

Embodiments will now be explained with reference to the accompanying drawings. Like components are provided with like reference signs throughout the drawings and repeated descriptions thereof are appropriately omitted. It is to be noted that an NAND flash memory (which will be also simply referred to as a "memory" hereinafter) will be described hereinafter, but the present invention is not restricted thereto and can be applied to any other memory having floating gates other than the NAND flash memory.

(1) First Embodiment

(a) Device Configuration

Figure 1:
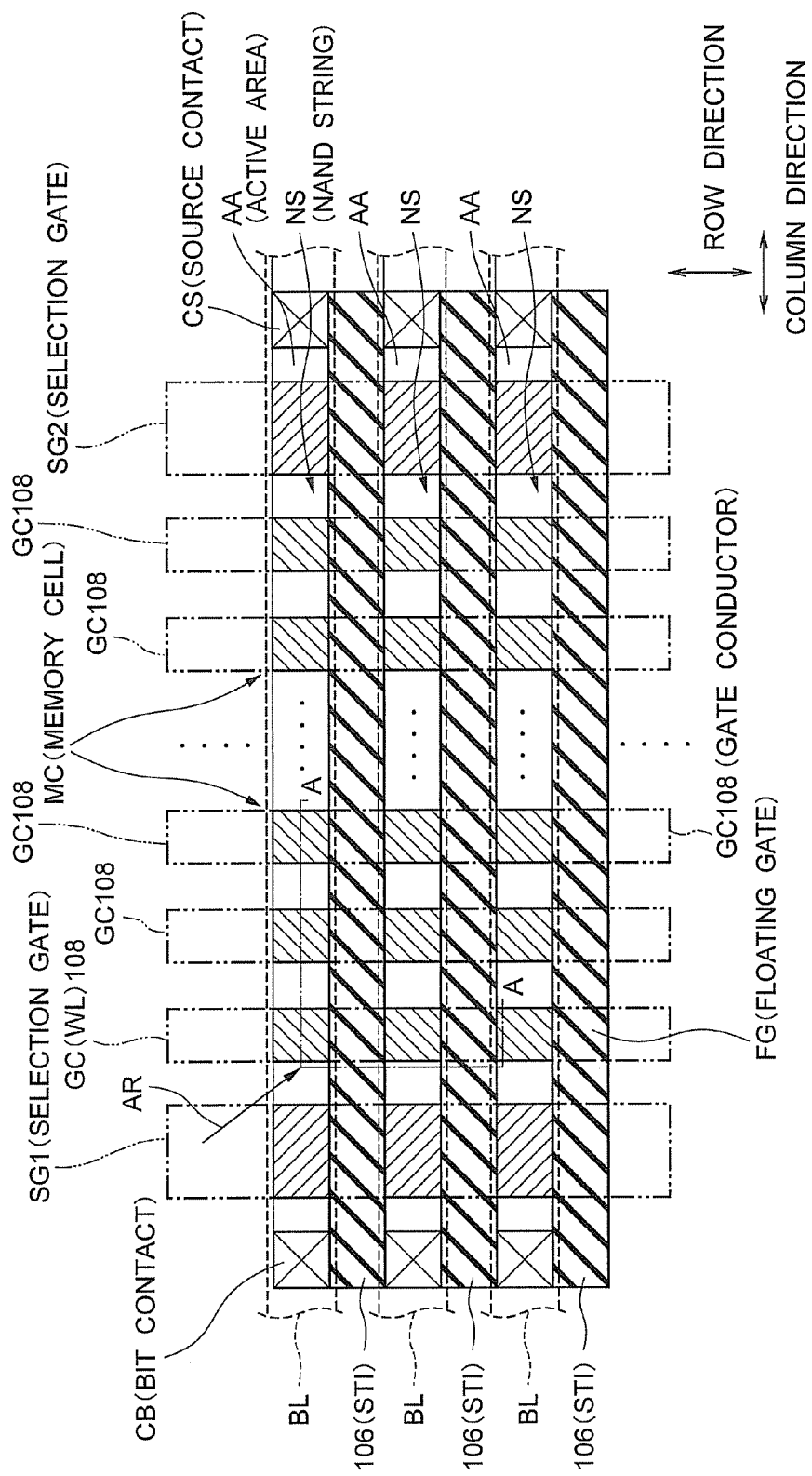
FIG. 1 is a plan view showing an example of a configuration of a memory according to a first embodiment.

FIG. 1 is a plan view showing an example of a configuration of a memory according to a first embodiment.

A memory according to this embodiment includes gate conductors (which will be simply referred to as GCs hereinafter) 108 extending in a row direction and bit lines BL extending in a column direction. Each GC 108 and each bit line BL orthogonally cross each other in this embodiment. In this embodiment, each GC 108 corresponds to, e.g., a control gate. Furthermore, the column direction corresponds to, e.g., a first direction, and the row direction corresponds to, e.g., a second direction in this embodiment.

A memory cell MC is provided in accordance with each intersecting point of the GC 108 and the bit line BL. Each memory cell MC is formed in each active area AA extending in the column direction. Both each active area AA and each insulating film 106 as shallow trench insulation (STI) extend in the column direction. The active areas AA and the insulating films 106 are alternately arranged in the row direction at a predetermined pitch and provided in a stripe pattern.

The NAND flash memory includes NAND strings NS each of which is constituted of the plurality of memory cells MC connected in series along the column direction. Although three NAND strings NS are shown in FIG. 1, many NAND strings are usually provided. Each NAND string NS is connected to each bit line BL through a selection gate SG1 and also connected to a source through a selection gate SG2.

It is to be noted that the column direction and the row direction are expedient names, and these names can be counterchanged.

Figure 2:
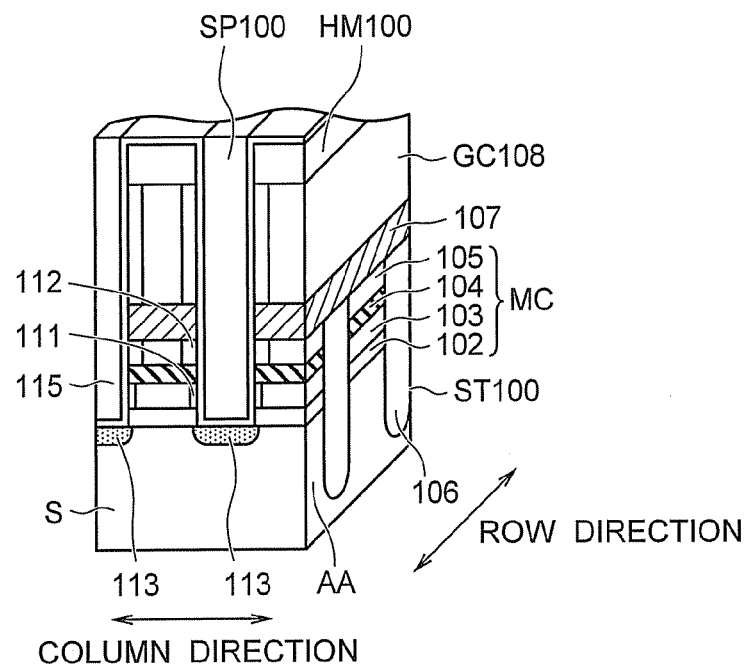
FIG. 2 is a cross-sectional perspective view of the memory depicted in FIG. 1.

FIG. 2 is a cross-sectional perspective view showing a cross section, which is taken along a cutting-plane line A-A in FIG. 1, and is viewed from a direction of an arrow AR1.

It is to be noted that, to simplify the explanation, the bit lines BL are omitted in the subsequent cross-sectional perspective views.

The memory cell MC is provided at each intersecting point of the GC 108 and the bit line BL on the active area AA of a semiconductor substrate S. The memory cell MC includes a first insulating film 102, a lower layer FG 103, a second insulating film 104, and an upper layer FG 105 which are sequentially laminated from a front surface side of the semiconductor substrate S. Each region between the memory cells MC in the row direction is the shallow trench isolation region, and the STI is formed of the insulating film 106. The GCs 108 extend on the memory cell MCs and the insulating films 106 via insulating films 107 along the row direction, and they are formed so as to be separated from each other in the column direction at a predetermined pitch. An insulating film 115 is formed in each region between the GCs 108, and an impurity diffusion layer 113 is formed on a surface layer of the semiconductor substrate S immediately below the insulating film 115. In this embodiment, both the first insulating film 102 and the second insulating film 104 correspond to, e.g., tunnel insulating films.

Of side surfaces of the lower layer FG 103 and the upper layer FG 105, oxides 111 and 112 are formed on sidewalls parallel to the row direction, respectively. A thickness of the oxide 112 is larger than that of the oxide 111. As a result, in the column direction, a size of the upper layer FG 105 is smaller than that of the lower layer FG 103.

Figure 3:
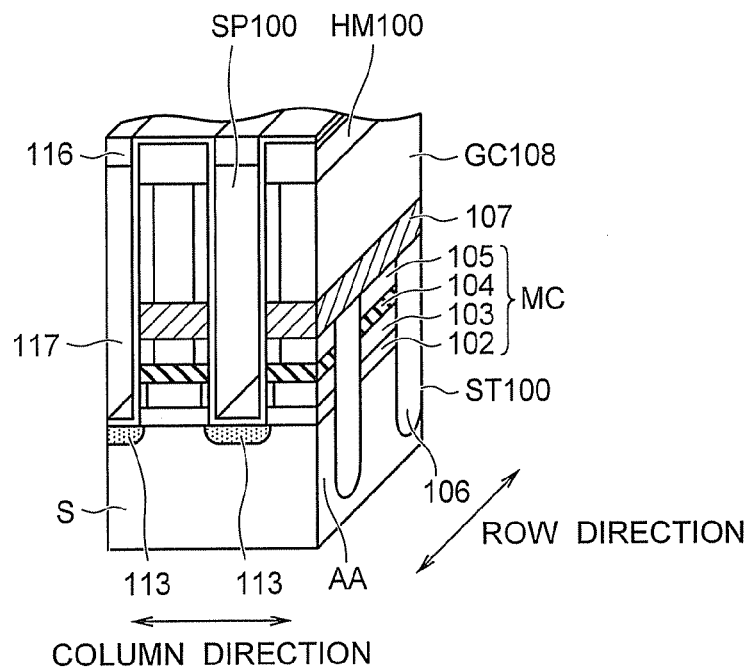
FIG. 3 is a cross-sectional perspective view showing a modification of the embodiment depicted in FIG. 2.

FIG. 3 is a cross-sectional perspective view showing a modification of the embodiment depicted in FIG. 2. In the memory shown in FIG. 1 and FIG. 2, each space SP 100 between laminated bodies, each including the memory cell MC, the insulating film 107 and the GC 108, is filled with the insulating film 115. In the memory according to this modification, an insulating film 116 of poorer coverage is formed in the space SP 100, and a cavity 117 is thereby formed.

(b) Manufacturing Method

A manufacturing method of the memory shown in FIG. 1 to FIG. 3 will now be described with reference to FIG. 4A to FIG. 4D.

First, on the semiconductor substrate S, the insulating film 102, the lower layer FG 103, the insulating film 104, and the upper layer FG 105 are sequentially formed.

A material of the insulating film 102 is selected from, e.g., a silicon oxide film, a silicon oxynitride film, and a silicon nitride film.

Each of the lower layer FG 103 and the upper layer FG 105 is formed of a single layer or a laminated layer of non-doped polysilicon or B or P-doped polysilicon, a metal such as TIN, TaN, or W, or a silicide of these materials. One of characteristics of the manufacturing method according to this embodiment is that, as a material of the upper layer FG 105, a material having a higher oxidation rate than that of the lower layer FG 103 is selected.

A material of the insulating film 104 is selected from, e.g., a silicon oxide film, a silicon oxynitride film, a silicon nitride film, $Al_2O_3$, $HfO_X$, $TaO_X$, and $La_2O_X$.

Subsequently, a resist (not shown) for forming a hard mask (not shown) and the shallow trench isolation is formed on the upper layer FG 105, then a desired AA pattern is formed by photolithography, shallow trench isolation grooves ST 100 (see FIG. 4A) are formed by performing etching such as reactive ion etching (RIE). The shallow trench isolation grooves ST 100 are then filled with the insulating films 106 such as silicon oxide films, and flattening is carried out by chemical and mechanical polishing (CMP) or wet etching until an upper end of the upper layer 105 is exposed.

Figures 4A, 4B:
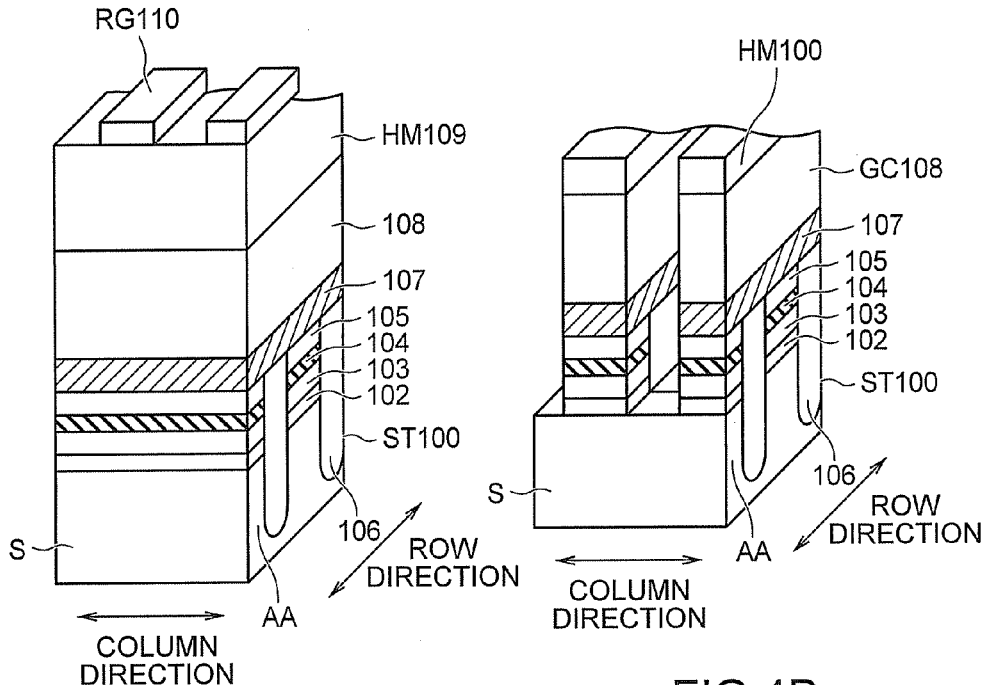
FIG. 4A to FIG. 4D are cross-sectional perspective views for explaining a manufacturing method for a memory depicted in each of FIG. 1 to FIG. 3.

Then, each resist RG 110 which is used for forming the insulating film 107, a conductive film 108, the hard mask HM 109, and a GC pattern is sequentially formed, and then a desired GC pattern is formed by photolithography as shown in FIG. 4A.

A material of the insulating film 107 is selected from, e.g., a silicon oxide film, a silicon oxynitride film, a silicon nitride film, $Al_2O_3$, $HfO_X$, $TaO_X$, and $La_2O_X$. Furthermore, a material of the conductive film 108 is selected from, e.g., non-doped polysilicon or B or P-doped polysilicon, a metal such as TIN, TaN, W, Ni, or Co and a silicide of these materials.

Subsequently, the layers from the conductive film 108 to the insulating film 102 is etched by the RIE or the like, and the GC pattern is formed as shown in FIG. 4B.

Figures 4C, 4D:
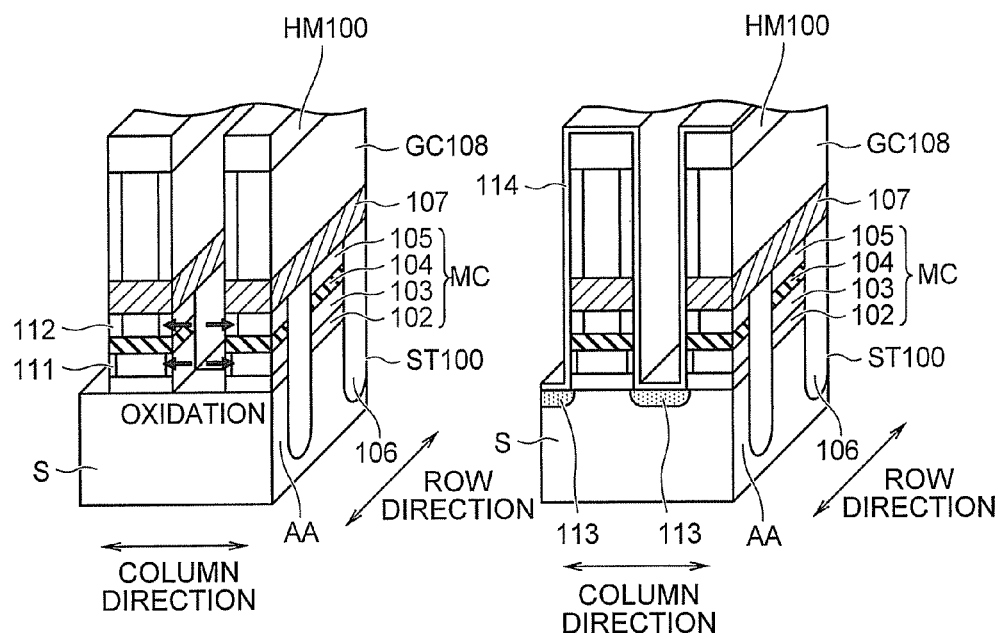

Then, as shown in FIG. 4C, sidewalls of the lower layer FG 103 and the upper layer FG 105 along the row direction are oxidized by using thermal oxidation or plasma oxidation. At this time, since the material of the upper layer FG 105 has a higher oxidation rate than the material of the lower layer FG 103, a film thickness of the oxide 112 formed on the sidewall of the upper layer FG 105 is larger than a film thickness of the oxide 111 formed on the sidewall of the lower layer FG 103.

For example, the upper layer FG 105 is made of P-doped polysilicon, the lower layer FG 103 is made of B-doped polysilicon, the laminated body including the GC 108, the memory cell MC, and the insulating film 107 shown in FIG. 4B is formed, the RIE process is performed, and then heating is carried out in an oxidizing atmosphere at 100° C. to 400° C.

Since the P-doped polysilicon which is an n-type semiconductor has a higher number of electronic carriers than the B-doped polysilicon which is a p-type semiconductor, the P-doped polysilicon is apt to be oxidized by supplying oxygen to the electrons. Therefore, the P-doped polysilicon in the upper layer has a higher oxidization rate than the B-doped polysilicon in the lower layer, and hence a silicon oxide film formed on the sidewall of the P-doped polysilicon in the upper layer FG 105 is thicker than that of the B-doped polysilicon in the lower layer FG 103. As a result, a size of the upper layer FG 105 in the column direction is smaller than a size of the lower layer FG 103 in the column direction.

Then, impurities are implanted into the active area AA between the GCs 108 by implantation, diffusion layers 113 serving as a source and a drain are formed, and an insulating film 114 such as a silicon oxide film having a thickness of several nm which is thinner than a half of a pitch (which will be referred to as "HP" hereinafter) between the GC 108 is formed on the sidewalls of the memory cell MC, the insulating film 107, and the GC 108, as shown in FIG. 4D.

At last, the space SP 100 between the insulating films 114 is filled with the insulating film 115 such as a silicon oxide film, whereby the memory shown in FIG. 2 is provided. Furthermore, in place of filling the space SP 100 with the insulating film 115, the cavity 117 may be formed by forming the insulating film 116 having poorer coverage. As a result, the memory according to the modification shown in FIG. 3 is provided.

(2) Second Embodiment (a) Device Configuration

Figure 5:
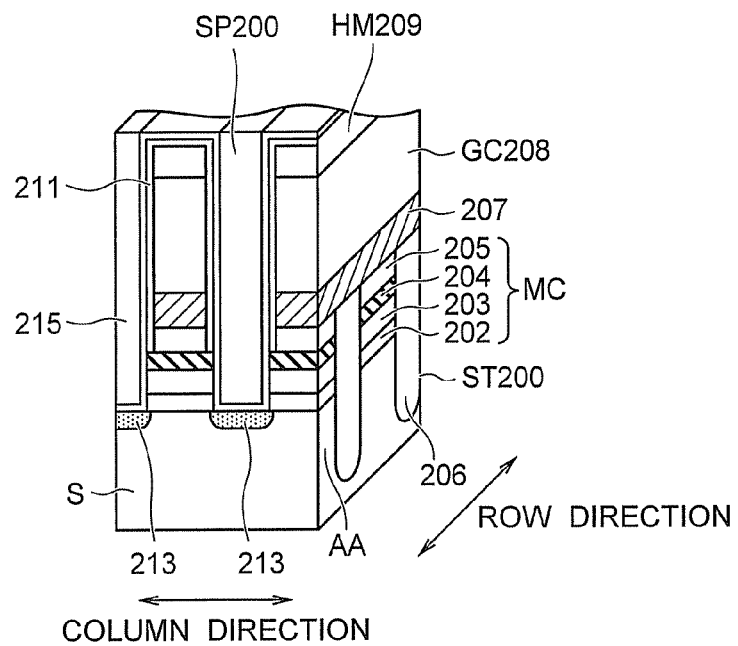
FIG. 5 is a cross-sectional perspective view showing an outline configuration of a memory according to a second embodiment.

FIG. 5 is a cross-sectional perspective view showing an outline configuration of a memory according to a second embodiment. A relationship between the cross-sectional perspective view of FIG. 5 and a top view of the memory according to this embodiment is the same as the relationship between FIG. 1 and FIG. 2, and FIG. 5 relates to a cross section taken along a cutting-plane line A-A in FIG. 1. This point is likewise applied to later-described third and fourth embodiments.

As obvious from comparison with FIG. 2, the memory according to this embodiment is characterized in that an insulating film like the insulating film 111 in FIG. 2 is not formed on the sidewall of the lower layer FG 203 and that the memory includes an insulating film 211 integrally formed from a sidewall of an upper layer FG 205 to a top face of a hard mask HM 209 in place of the oxide 112 formed on the sidewall of the upper layer FG 105 in FIG. 2. Other structures of the memory according to this embodiment correspond to those with reference numerals of the first embodiment having 100 added thereto, and they are substantially equal to those in the memory shown in FIG. 1 and FIG. 2.

Figure 6:
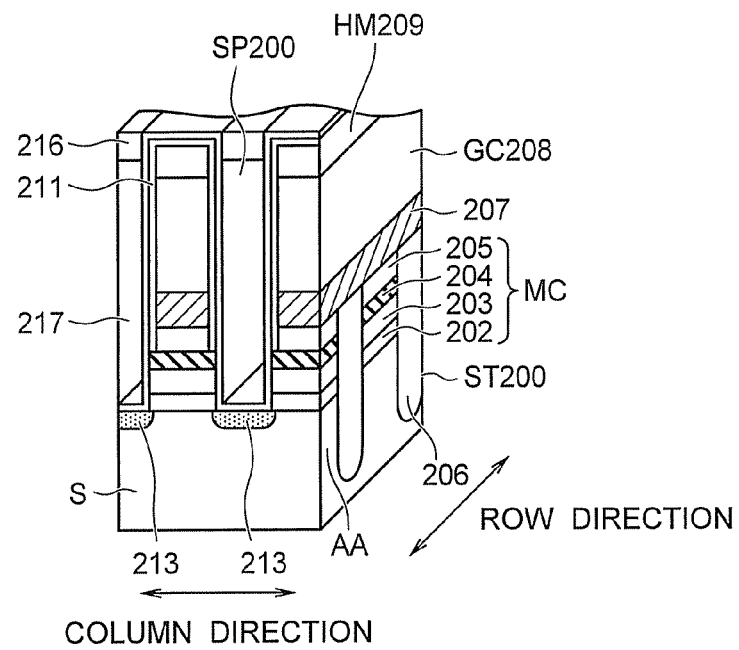
FIG. 6 is a cross-sectional perspective view showing a modification of the embodiment depicted in FIG. 5.

FIG. 6 is a cross-sectional perspective view showing a modification of the embodiment depicted in FIG. 5. In the memory shown in FIG. 5 a space SP 200 between laminated bodies, each including a memory cell MC, an insulating film 207, and a GC 208, is filled with an insulating film 215. In the memory according to this modification, an insulating film 216 of poorer coverage is formed on a sidewall of the space SP 200, whereby a cavity 217 is formed.

(b) Manufacturing Method

A manufacturing method of the memory shown in FIG. 5 and FIG. 6 will now be described with reference to FIG. 7A to FIG. 7E.

First, an insulating film 202, the lower layer FG 203, an insulating film 204, and the upper layer FG 205 are sequentially formed on a semiconductor substrate S.

A material of the insulating film 202 is selected from, e.g., a silicon oxide film, a silicon oxynitride film, and a silicon nitride film.

Each of the lower layer FG 203 and the upper layer FG 205 is formed of a single layer or a laminated layer of non-doped polysilicon or B or P-doped polysilicon, a metal such as TiN, TaN, or W, or a silicide of these materials. However, in this embodiment, as different from the lower layer FG 103 and the upper layer FG 105 shown in FIG. 2 and FIG. 3, the material of the lower layer FG 203 does not have to be different from the material of the upper layer FG 205 in particular in terms of an oxidation rate.

A material of the insulating film 204 is selected from, e.g., a silicon oxide film, a silicon oxynitride film, a silicon nitride film, $Al_2O_3$, $HfO_X$, $TaO_X$, and $La_2O_X$.

Subsequently, a resist (not shown) for forming a hard mask (not shown) and shallow trench isolation is formed on the upper layer FG 205, then a desired AA pattern is formed by photolithography, shallow trench isolation grooves ST 200 (see FIG. 7A) are formed by performing etching such as RIE. The shallow trench isolation grooves ST 200 are then filled with the insulating films 206 such as silicon oxide films, and flattening is carried out by CMP or wet etching until an upper end of the upper layer 205 is exposed.

Subsequently, each resist RG 210 which is used for forming the insulating film 207, a conductive film 208, the hard mask HM 209, and a GC pattern is sequentially formed, and then a desired GC pattern is formed by photolithography as shown in FIG. 7A.

A material of the insulating film 207 is selected from, e.g., a silicon oxide film, a silicon oxynitride film, a silicon nitride film, $Al_2O_3$, $HfO_X$, $TaO_X$, and $La_2O_X$. Furthermore, a material of the conductive film 208 is selected from, e.g., non-doped polysilicon or B or P-doped polysilicon, a metal such as TiN, TaN, W, Ni, or Co and a silicide of these materials.

Then, as shown in FIG. 7B, half etching is carried out until any position between an upper end of the upper layer FG 205 and a lower end of the lower layer FG 203 is reached, and the insulating film 211 with a thickness which is approximately several nm and thinner than a thickness of the HP is formed on the entire surface as shown in FIG. 7C.

In this manner, when a position at which the half etching is stopped is controlled so as to be placed between the upper end of the upper layer FG 205 and the lower end of the lower layer FG 203, a width of a top face of the upper layer FG 205 in the column direction can be narrowed without changing a width of a bottom face of the lower layer FG 203 in the column direction. As a result, the inter-cell interference effect can be reduced. In this embodiment, the insulating film 211 corresponds to, e.g., a fourth insulating film.

Then, as shown in FIG. 7D, the etching is again carried out by the RIE or the like until at least the insulating film 202 is exposed.

Thereafter, as shown in FIG. 7E, like the first embodiment, impurities are implanted, diffusion layers 213 serving as a source and a drain are formed, and an insulating film 214 such as a silicon oxide film having a thickness of several nm which is thinner than the HP is formed on the sidewalls. At last, the space SP 200 between laminated bodies each including the memory cell MC, the insulating film 207, and the GC 208 is filled with the insulating film 215 such as a silicon oxide film, whereby the memory shown in FIG. 5 is provided. Furthermore, in place of filling the space SP 200 with the insulating film 215, the cavity 117 may be formed by forming the insulating film 216 having poorer coverage. As a result, the memory according to the modification shown in FIG. 6 is provided.

In this embodiment, sizes and shapes of the upper layer FG 205 and the lower layer FG 203 vary depending on a position at which the half etching is stopped between the upper end of the upper layer FG 205 and the lower end of the lower layer FG 203. This point will now be specifically explained with reference to FIG. 8A to FIG. 8D.

Each of FIG. 8A to FIG. 8D is a cross-sectional view obtained by cutting a memory having a double FG configuration along a cutting-plane line parallel to the bit lines (in the column direction). As a memory shown in FIG. 8A, a reference example where members from the tunnel insulating film to the GC immediately above the semiconductor substrate S have the same size is illustrated. In all of FIG. 8B to FIG. 8D, a size of the bottom face of the lower layer FG 203 in the column direction is the same as that in the reference example in FIG. 8A, a size of the top face of the upper layer FG 205 in the column direction is smaller than a size of the bottom face of the lower layer FG 203 in the column direction.

Figure 8A:
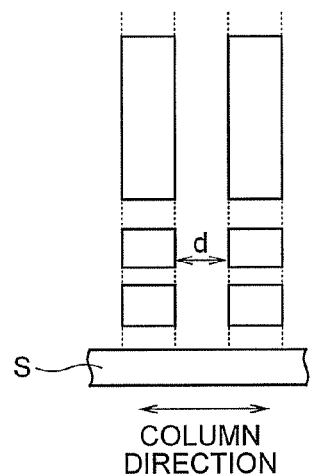
FIG. 8A to FIG. 8D are cross-sectional views for explaining a relationship between a stop position of half etching and sizes and shapes of FGs in upper and lower layers depicted in FIG. 7B.
Figures 8B, 8C, 8D:
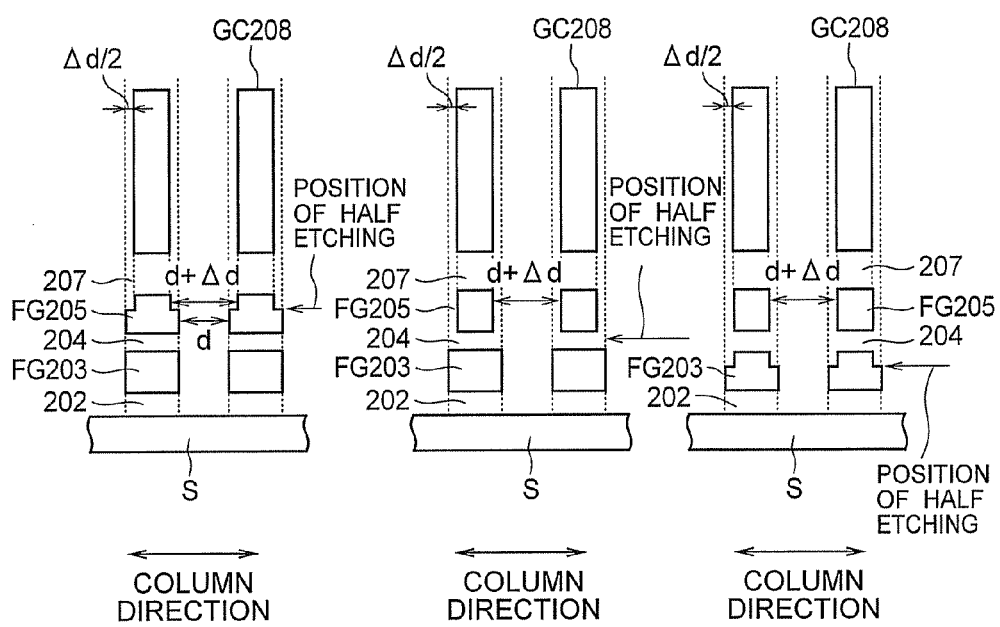

FIG. 8B to FIG. 8D show examples of the memory according to this embodiment, and respective examples are illustrated in which the stop position of the half etching is varied in the process shown in FIG. 7B. FIG. 8B shows a situation where the half etching is stopped at a halfway position between the upper end and the lower end of the upper layer FG 205, FIG. 8C shows a situation where the half etching is stopped at a halfway position between the upper end and the lower end of the insulating film 204 in the upper layer, and FIG. 8D shows a situation where the half etching is stopped at a halfway position between the upper end and the lower end of the lower layer FG 203.

In the case of FIG. 8B, a step is produced on the sidewall of the upper layer FG 205, and a size of the top face of the FG 205 in the column direction is different from a size of the bottom face of the FG 205 in the column direction. Therefore, there are a position where the adjoining upper layer FGs 205 are apart from each other by a distance d and another position where the same are apart from each other by a distance (d+Δd). Moreover, since there is the position where these adjoining upper layer FGs 205 are apart from each other by the distance (d+Δd) is provided, the inter-cell interference effect is smaller than that in the reference example in FIG. 8A.

In the case of FIG. 8C, there is no step formed on the sidewalls of both the upper layer FG 205 and the lower layer FG 203, a size of the upper layer FG 205 in the column direction is Δd smaller than a size of the lower layer FG 203 in the column direction. Therefore, the adjoining upper layer FGs 205 apart from each other by a distance (d+Δd), and the inter-cell interference effect is Δd smaller than that of the reference example in FIG. 8A.

In the case of FIG. 8D, although there is no step on the sidewall of the upper layer FG 205, a step is formed on the sidewall of the lower layer FG 203. Therefore, sizes of the top face and the bottom face of the upper layer FG 205 in the column direction are equal to a size of the top face of the lower layer FG 203 in the column direction, but they are smaller than a size of the bottom face of the lower layer FG 203. Additionally, like FIG. 8C, the adjoining upper layer FGs 205 are apart from each other by a distance (d+Δd), and the inter-cell interference effect is Δd smaller than that of the reference example in FIG. 8A.

Although a value of Δd shown in each of FIG. 8B to FIG. 8D is allowed as long as it does not affect transistor characteristics, it is desirable for Δd/2 to fall within the range of approximately 5% to approximately 20% of a bottom face size of the lower layer FG 203 at each end portion in the column direction.

(3) Third Embodiment

(a) Device Configuration

Figure 9:
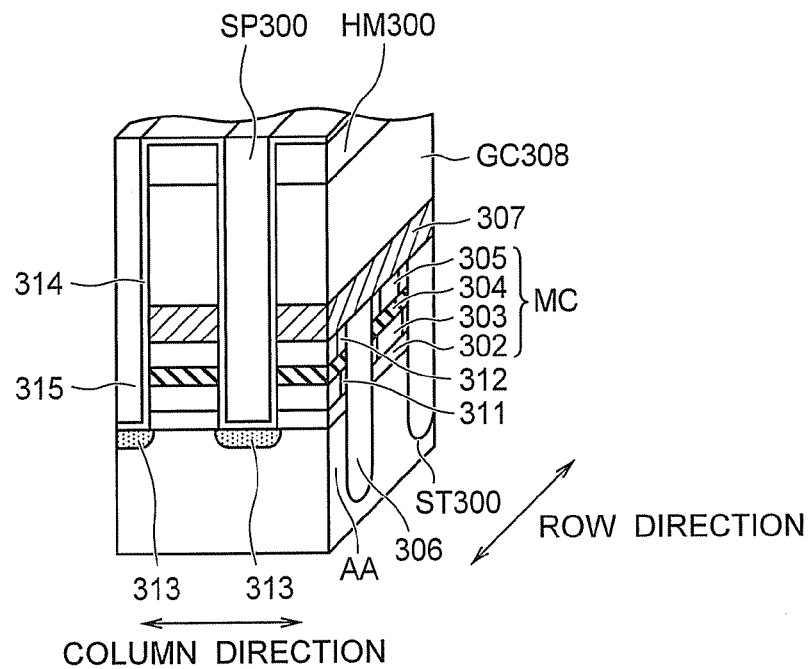
FIG. 9 is a cross-sectional perspective view showing an outline configuration of a memory according to a third embodiment.

FIG. 9 is a cross-sectional perspective view showing an outline configuration of a memory according to the third embodiment. As obvious from comparison with FIG. 2, the memory according to this embodiment is characterized in that oxides 311 and 312 are formed on sidewalls parallel to the column direction, of side surfaces of a lower layer FG 303 and an upper layer FG 305, respectively and that the oxide 312 is formed with a thickness larger than that of the oxide 311. As a result, in the row direction, a size of the upper layer FG 305 is smaller than that of the lower layer FG 303. Other structures of the memory according to this embodiment correspond to those with reference numerals of the first embodiment with 200 added thereto, and they are substantially equal to those in the memory shown in FIG. 1 and FIG. 2.

Figure 10:
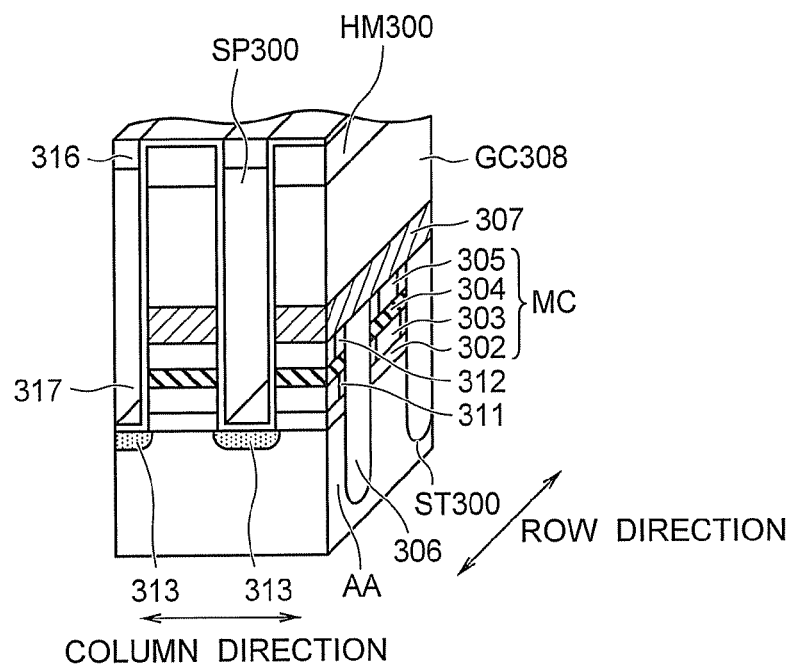
FIG. 10 is a cross-sectional perspective view showing a modification of the embodiment depicted in FIG. 9.

FIG. 10 is a cross-sectional perspective view showing a modification of the embodiment depicted in FIG. 9. In the memory shown in FIG. 10 a space SP 300 between laminated bodies, each including a memory cell MC, an insulating film 307, and a GC 308 is filled with an insulating film 315. In the memory according to this modification, an insulating film 316 of poorer coverage is formed on a sidewall of the space SP 300 whereby a cavity 317 is formed.

(b) Manufacturing Method

A manufacturing method of the memory shown in FIG. 9 and FIG. 10 will now be described with reference to FIG. 11A to FIG. 11E.

Figure 11A:
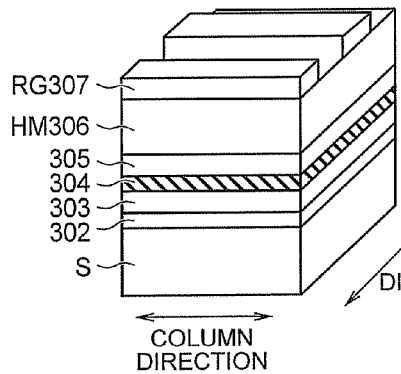
FIG. 11A to FIG. 11E are cross-sectional perspective views for explaining a manufacturing method of the memory depicted in FIG. 9 and FIG. 10.

First, an insulating film 302, the lower layer FG 303, an insulating film 304, and the upper layer FG 305, a hard mask HM 306, and a resist RG 307 are formed on a semiconductor substrate S, and a desired AA pattern is formed by the photolithography as shown in FIG. 11A.

A material of the insulating film 302 is selected from, e.g., a silicon oxide film, a silicon oxynitride film, and a silicon nitride film.

Each of the lower layer FG 303 and the upper layer FG 305 is formed of a single layer or a laminated layer of non-doped polysilicon or B or P-doped polysilicon, a metal such as TiN, TaN, or W, or a silicide of these materials. In this embodiment, as a material of the upper layer FG 305, a material having an oxidation rate higher than that of the lower layer FG 303 is selected.

A material of the insulating film 304 is selected from, e.g., a silicon oxide film, a silicon oxynitride film, a silicon nitride film, $Al_2O_3$, $HfO_X$, $TaO_X$, and $La_2O_X$.

Figure 11B:
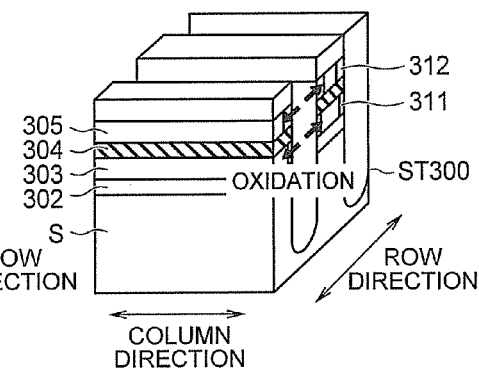

Then, each shallow trench isolation groove ST 300 is formed by etching such as RIE, and sidewalls of the lower layer FG 303 and the upper layer FG 305 are oxidized by thermal oxidation or plasma oxidation as shown in FIG. 11B. At this time, since the material of the upper layer FG 305 has a higher oxidation rate than the material of the lower layer FG 303, a thickness of the oxide 312 formed on the sidewall of the upper layer FG 305 is larger than a thickness of the oxide 311 formed on the sidewall of the lower layer FG 303.

For example, the upper layer FG 305 is made of P-doped polysilicon, and the lower layer FG 303 is made of B-doped polysilicon. When heating is carried out in an oxidizing atmosphere at 100° C. to 400° C., since the P-doped polysilicon which is an n-type semiconductor has a higher number of electronic carriers than the B-doped polysilicon which is a p-type semiconductor, the P-doped polysilicon is apt to be oxidized by supplying oxygen to the electrons. Therefore, the upper layer FG 305 made of the P-doped polysilicon has a higher oxidization rate than the lower layer FG 303 made of the B-doped polysilicon, and hence a silicon oxide film formed on the sidewall of the P-doped polysilicon in the upper layer FG 305 is thicker than that of the B-doped polysilicon in the lower layer FG 303.

Figure 11C:
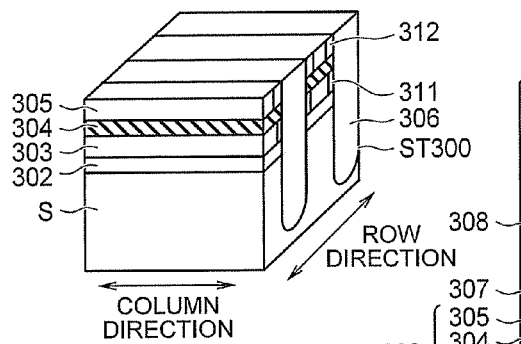

Then, as shown in FIG. 11C, the shallow trench isolation grooves ST 300 are filled with the insulating films 306 such as silicon oxide films, and flattening is carried out by CMP or wet etching until an upper end of the upper layer 305 is exposed.

Figure 11D:
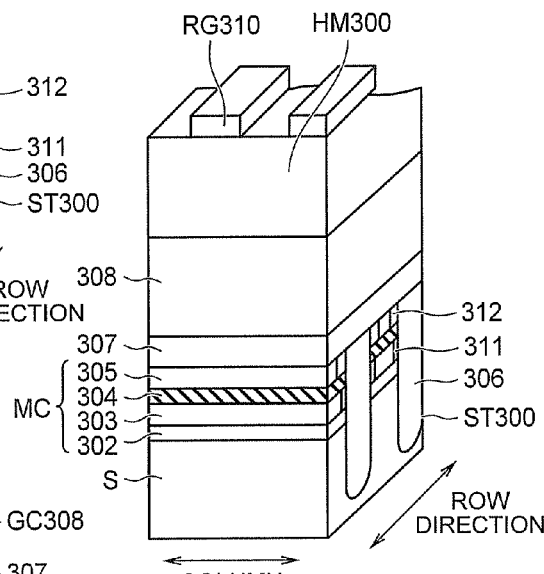

Subsequently, the insulating film 307, the conductive film 308, the hard mask HM 300, and a resist RG 310 forming a GC pattern are formed, and then a desired GC pattern is formed by photolithography as shown in FIG. 11D.

Here, the insulating film 307 is formed by using a silicon oxide film, a silicon oxynitride film, a silicon nitride film, $Al_2O_3$, $HfO_X$, $TaO_X$, $La_2O_X$, and others, and the conductive film 308 is made of non-doped polysilicon or B or P-doped polysilicon, a metal such as TIN, TaN, W, Ni, or Co or a silicide of these materials.

Figure 11E:
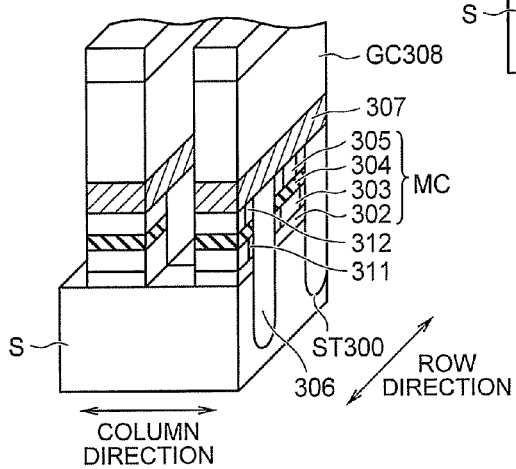

Subsequently, the layers from the conductive film 308 to the insulating film 302 are selectively removed by RIE or the like, whereby a GC pattern is formed as shown in FIG. 11E.

Then, impurities are implanted into the active area AA between laminated bodies, each including the memory cell MC, the insulating film 307 and the GC 308, diffusion layers 313 that serve as a source and a drain are formed, and an insulating film 314 (see FIG. 9) such as a silicon oxide film having a thickness of several nm which is thinner than the HP is formed on a sidewall of each laminated body including the memory cell MC, the insulating film 307, and the GC 308.

At last, the space SP 300 between the laminated bodies, each including the memory cell MC, the insulating film 307 and the GC 308, is filled with the insulating film 315 such as a silicon oxide film, thus the memory shown in FIG. 9 is provided. Furthermore, in place of filling the space SP 300 with the insulating film 315, the cavity 317 may be formed by forming the insulating film 316 having poorer coverage. As a result, the memory according to the modification shown in FIG. 10 is provided.

(4) Fourth Embodiment (a) Device Configuration

Figure 12:
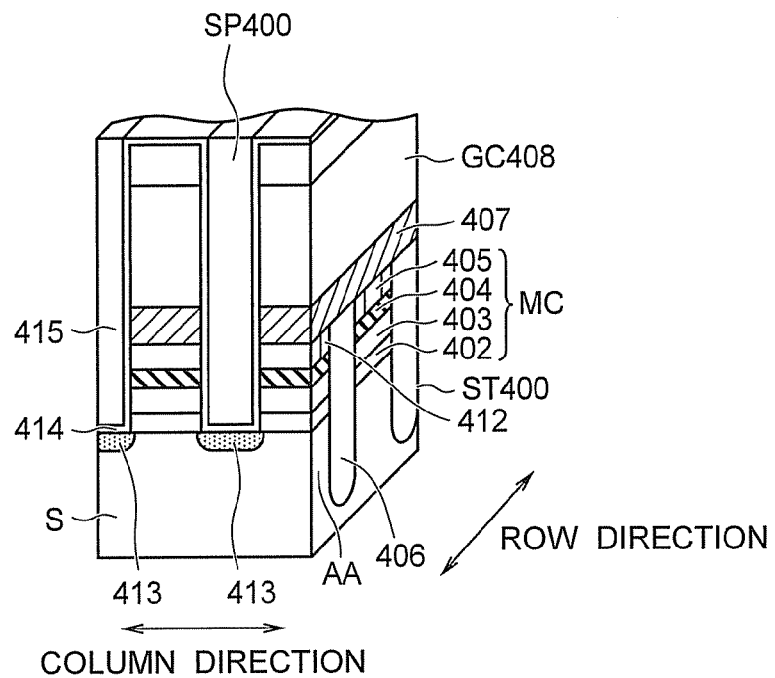
FIG. 12 is a cross-sectional perspective view showing an outline configuration of a memory according to a fourth embodiment.

FIG. 12 is a cross-sectional perspective view showing an outline configuration of a memory according to a fourth embodiment. As obvious from comparison with FIG. 9, the memory according to this embodiment is characterized in that an insulating film like the insulating film 311 in FIG. 9 is not formed on a sidewall of a lower layer FG 403 and that a thin insulating film 412 is provided on a sidewall of an upper layer FG 305 in place of the oxide 312 formed on the sidewall of the upper layer FG 305 in FIG. 9. Other structures of the memory according to this embodiment correspond to those with reference numerals of the third embodiment with 100 added thereto, and they are substantially equal to those in the memory shown in FIG. 9.

Figure 13:
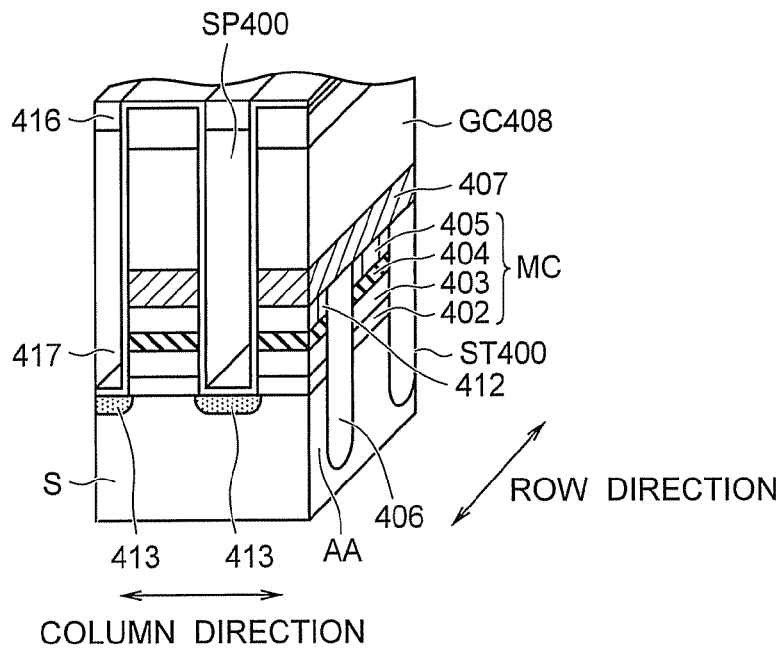
FIG. 13 is a cross-sectional perspective view showing a modification of the embodiment depicted in FIG. 12.

FIG. 13 is a cross-sectional perspective view showing a modification of the embodiment depicted in FIG. 12. In the memory shown in FIG. 13 a space SP 400 between laminated bodies, each including a memory cell MC, an insulating film 407 and a GC 408, is filled with an insulating film 415. In the memory according to this modification an insulating film 416 having poorer coverage is formed on a sidewall of the space SP 400, whereby a cavity 417 is formed.

(b) Manufacturing Method

A manufacturing method of the memory shown in FIG. 12 and FIG. 13 will now be described with reference to FIG. 14A to FIG. 14E.

Figure 14A:
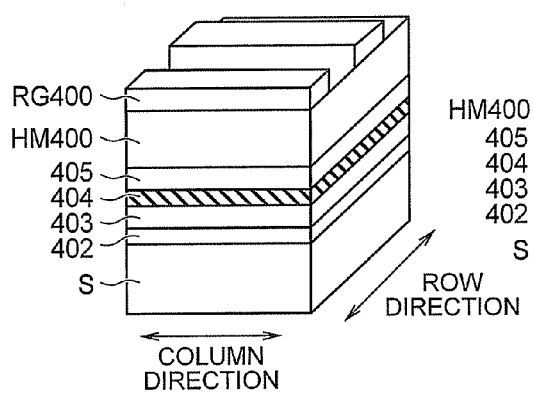
FIG. 14A to FIG. 14E are cross-sectional perspective views for explaining a manufacturing method of the memory depicted in FIG. 12 and FIG. 13.

First, an insulating film 402, the lower layer FG 403, an insulating film 404, an upper layer FG 405, a hard mask HM 400, and a resist RG 400 are formed on a semiconductor substrate S, and a desired AA pattern is formed by photolithography as shown in FIG. 14A.

A material of the insulating film 402 is selected from, e.g., a silicon oxide film, a silicon oxynitride film, and a silicon nitride film. Each of the lower layer FG 403 and the upper layer FG 405 is formed of a single layer or a laminated layer of non-doped polysilicon or B or P-doped polysilicon, a metal such as TIN, TaN, or W, or a silicide of these materials. In this embodiment, as different from the lower layer FG 303 and the upper layer FG 305 shown in FIG. 9 and FIG. 10, the material of the lower layer FG 403 does not have to be different from the material of the upper layer FG 405 in particular in terms of an oxidation rate. A material of the insulating film 404 is selected from, e.g., a silicon oxide film, a silicon oxynitride film, a silicon nitride film, $Al_2O_3$, $HfO_X$, $TaO_X$, and $La_2O_X$.

Figure 14B:
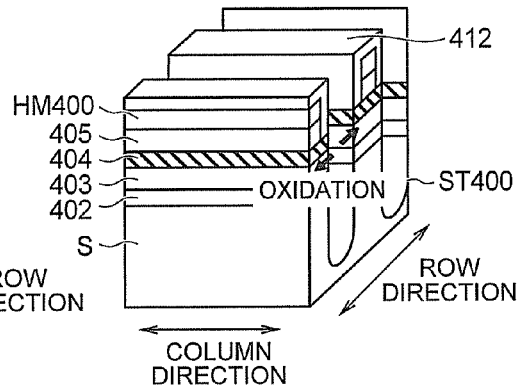

Subsequently, half etching is carried out by RIE or the like until at least any position between the upper end of the upper layer FG 405 and the lower end of the lower layer FG 403 is reached, then the insulating film 412 with a thickness of approximately several nm which is thinner than ½ of the HP is formed, etching is again effected by the RIE or the like until an arbitrary position in the semiconductor substrate S is reached, an each shallow trench isolation groove ST 400 is formed as shown in FIG. 14B.

In this manner, when a position at which the half etching is stopped is controlled so as to be placed between the upper end of the upper layer FG 405 and the lower end of the lower layer FG 403, a width of a top face of the upper layer FG 405 in the row direction can be narrowed without changing a width of a bottom face of the lower layer FG 403 in the row direction. As a result, the inter-cell interference effect can be reduced. In this embodiment, the insulating film 412 corresponds to, e.g., a fourth insulating film.

Figure 14C:
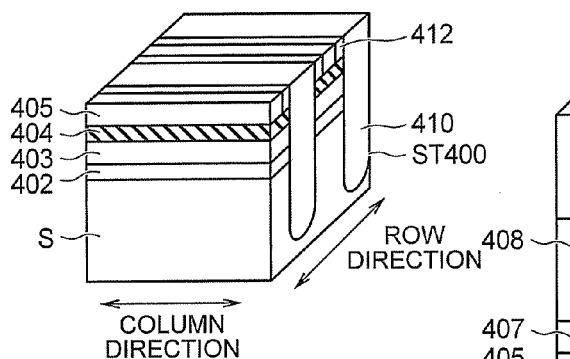

Then, as shown in FIG. 14C, the shallow trench isolation grooves ST 400 are filled with an insulating films 410 such as silicon oxide films, and flattening is carried out by CMP or wet etching until an upper end of the upper layer 405 is exposed.

Figure 14D:
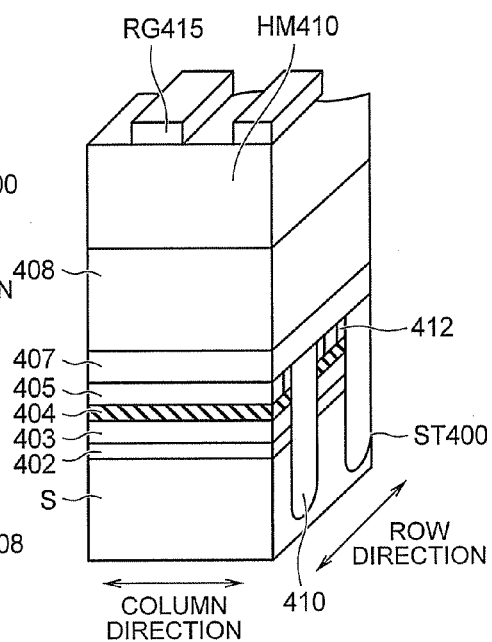

Subsequently, the insulating film 407, the conductive film 408, a hard mask HM 410, and a resist RG 415 for forming a GC pattern are formed, and then a desired GC pattern is formed by photolithography as shown in FIG. 14D.

A material of the insulating film 407 is selected from, e.g., a silicon oxide film, a silicon oxynitride film, a silicon nitride film, $Al_2O_3$, $HfO_X$, $TaO_X$, $La_2O_X$, and others. The conductive film 308 is made of non-doped polysilicon or B or P-doped polysilicon, a metal such as TIN, TaN, W, Ni, or Co, or a silicide of these materials.

Figure 14E:
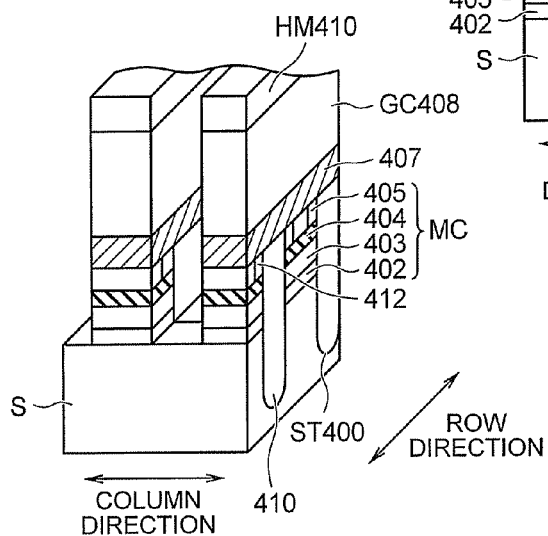

Subsequently, the layers from the conductive film 408 to the insulating film 402 are selectively removed by RIE or the like, whereby a GC pattern is formed as shown in FIG. 14E.

Then, impurities are implanted into the active area AA between laminated bodies, each including the memory cell MC, the insulating film 407 and the GC 408, diffusion layers 413 that serve as a source and a drain are formed, and an insulating film 414 (see FIG. 12) such as a silicon oxide film having a thickness of several nm which is thinner than the HP is formed on a sidewall of each laminated body including the memory cell MC, the insulating film 407, and the GC 408.

At last, the space SP 400 between the laminated bodies, each including the memory cell MC, the insulating film 407 and the GC 408, is filled with the insulating film 415 such as a silicon oxide film, thus the memory shown in FIG. 12 is provided. Furthermore, in place of filling the space SP 400 with the insulating film 415, the cavity 417 may be formed by forming the insulating film 416 having poorer coverage. As a result, the memory according to the modification shown in FIG. 13 is provided.

In this embodiment, sizes and shapes of the upper layer FG 405 and the lower layer FG 403 vary in accordance with a position where the half etching in the process shown in FIG. 14B is stopped in the range from the upper end of the upper layer FG 405 to the lower end of the lower layer FG 403. This point will now be specifically described with reference to FIG. 15A to FIG. 15D.

Figure 15A:
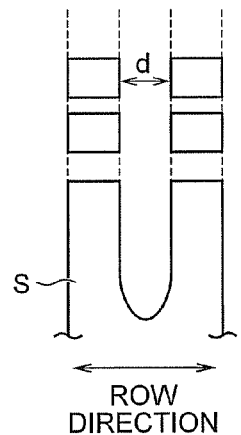
FIG. 15A to FIG. 15D are cross-sectional views for explaining a relationship between a stop position of half etching and sizes and shapes of FGs in upper and lower layers depicted in FIG. 14B.

Each of FIG. 15A to FIG. 15D is a cross-sectional view obtained by cutting a memory of a double FG configuration along a cutting-plane line parallel to the GCs (in the row direction). As reference examples two memories are shown in FIG. 15A, in which sizes in the row direction are the same in a range from a tunnel insulating film to the GC immediately above the semiconductor substrate S.

Figures 15B, 15C, 15D:
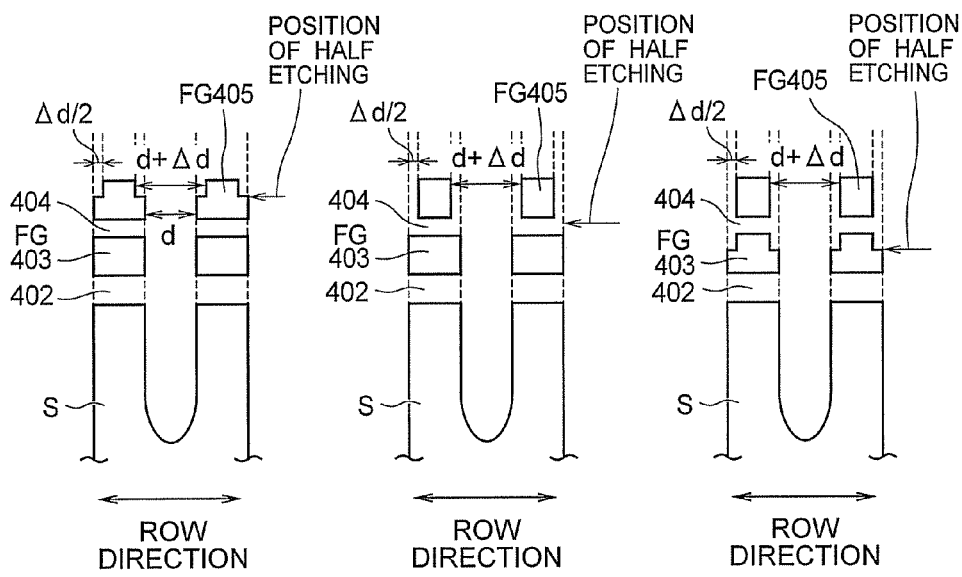

FIG. 15B to FIG. 15D show examples of the memory according to this embodiment. In these figures respective examples are illustrated in which the stop position of the half etching is changed in the process shown in FIG. 14B. FIG. 15B shows a situation where the half etching is stopped at a halfway position between the upper and lower ends of the upper layer FG 405, FIG. 15C shows a situation where the half etching is stopped at a halfway position between the upper and lower ends of the insulating film 404 in the upper layer, and FIG. 15D shows a situation where the half etching is stopped at a halfway position between the upper and lower ends of the lower layer FG 403.

In the case of FIG. 15B, a step is produced on the sidewall of the upper layer FG 405, and a size of the top face of the FG 405 in the row direction is different from a size of the bottom face of the FG 405 in the row direction. Therefore, there are a position where the adjoining upper layer FGs 405 are apart from each other by a distance d and another position where the same are apart from each other by a distance (d+Δd).

Moreover, since the position where the adjoining upper layer FGs 405 are apart from each other by the distance (d+Δd) is provided, the inter-cell interference effect is smaller than that in the reference example in FIG. 15A.

In the case of FIG. 15C, there is no step formed on the sidewalls of both the upper layer FG 405 and the lower layer FG 403, a size of the upper layer FG 405 in the row direction is Δd smaller than a size of the lower layer FG 403 in the row direction. Therefore, the adjoining upper layer FGs 405 are apart from each other by a distance (d+Δd), and the inter-cell interference effect is Δd smaller than that of the reference example in FIG. 15A.

In the case of FIG. 15D, although there is no step on the sidewall of the upper layer FG 405, a step is formed on the sidewall of the lower layer FG 403. Therefore, sizes of the top face and the bottom face of the upper layer FG 405 in the row direction are equal to a size of the top face of the lower layer FG 403 in the row direction, but it is smaller than a size of the bottom face of the lower layer FG 403. Additionally, like FIG. 15C, the adjoining upper layer FGs 405 are apart from each other by a distance (d+Δd), and the inter-cell interference effect is Δd smaller than that of the reference example in FIG. 15A.

Although a value of Δd shown in each of FIG. 15B to FIG. 15D is allowed as long as it does not affect transistor characteristics, it is desirable for Δd/2 to fall within the range of approximately 5% to approximately 20% of a bottom face size of the lower layer FG 403 at each end portion in the row direction.

According to the memory of each of the foregoing first to fourth embodiments, the memory is formed in a manner that the size of the top face of the upper layer FG is smaller than the size of the bottom face of the lower layer FG in at least one of the column direction and the row direction. Thus, when a width of the top face of the upper layer FG is narrowed with a width of the bottom face of the lower layer FG 103 kept equivalent to that, for example, in a conventional configuration, the inter-cell interference effect can be reduced while maintaining transistor characteristics such as sub-threshold characteristics and others.

Additionally, according to the memory of each of the foregoing modifications, the cavity is formed in the region between the GCs, a capacity between the GCs can thus be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and sprit of the inventions.

For example, in the foregoing embodiments, although the description has been given as to the situation where the size of the top face of the upper layer FG is smaller than the size of the bottom face of the lower layer FG in one of the column direction and the row direction, the present invention is not restricted thereto, and it is possible to adopt a conformation where the size of the top face of the upper layer FG is smaller than the size of the bottom face of the lower layer FG in both the column direction and the row direction as a matter of course. As a manufacturing method in this case, it is possible to use a combination of the third embodiment and the first and second embodiments and a combination of the fourth embodiment and the first and second embodiments.

Furthermore, although the semiconductor substrate has been described as the substrate, but the present invention is not restricted thereto, and it is also possible to form the memory according to each of the foregoing embodiments on, e.g., a glass substrate or a ceramic substrate as long as the substrate has a semiconductor layer formed on a front surface.

Moreover, in the foregoing embodiments, although the description has been given as to the case where the tunnel insulating film and the floating gate are laminated on the substrate twice and the memory cell is thereby formed. However, the number of times of performing the lamination is not restricted to two, and the lamination may be carried out more than twice in order to form the memory cell. In this case, a dimension of a top face of any floating gate formed in a second layer (N=2) or a subsequent layer is smaller than a dimension of a bottom face of the floating gate in a first layer which is the lowermost layer.

The accompanying claims and their equivalents are intended to cover the above mentioned forms or modifications as would fall within the scope and spirit of the inventions.

The invention claimed is:

1. A semiconductor memory device comprising:
   a substrate comprising a semiconductor layer on a front surface thereof; and
   a plurality of memory cells on the semiconductor layer, wherein each memory cell comprises:
   a laminated body with a tunnel insulating film and a floating gate on the tunnel insulating film which are laminated in a direction vertical to the front surface of the substrate for N (a natural number equal to or above 2) times;
   a gate insulating film on the laminated body; and
   a control gate on the gate insulating film, and
   in at least one of a first direction parallel to the front surface of the substrate and a second direction crossing the first direction, a dimension of a top face of any floating gate in a second or subsequent layer in the floating gates is smaller than a dimension of a bottom surface of the floating gate in the lowermost layer.

2. The device of claim 1,
wherein a space between arbitrary floating gates in the second or subsequent layer in the floating gates is wider than a space between the floating gates in the lowermost layer.

3. The device of claim 1,
wherein the top face of the floating gate in the lowermost layer and the bottom face of the floating gate in the second layer have the same size.

4. The device of claim 3,
wherein a size of a surface of the floating gate in the second layer on the gate insulating film side is smaller than a size of a surface of the floating gate in the second layer which faces the substrate.

5. The device of claim 1,
wherein a size of the bottom face of the floating gate in the second layer is smaller than a size of the bottom face of the floating gate in the lowermost layer.

6. The device of claim 5,
wherein a size of a surface of the floating gate in the lowermost layer on the same side as the floating gate in the second layer is smaller than a size of a surface of the floating gate in the lowermost layer which faces the substrate.

7. The device of claim 1,
wherein an oxidation rate of a material of the floating gate in the second or subsequent layer is higher than an oxidation rate of the floating gate in the lowermost layer.

8. The device of claim 1, further comprising an insulating film which is formed on a sidewall of each floating gate in the second or subsequent layer between the memory cells and extends to a side surface of the control gate.

9. The device of claim 1, further comprising an insulating film in which a cavity is provided in a region between the respective memory cells.

* * * * *